(12) United States Patent
Wu et al.

(10) Patent No.: US 7,884,644 B1
(45) Date of Patent: Feb. 8, 2011

(54) TECHNIQUES FOR ADJUSTING LEVEL SHIFTED SIGNALS

(75) Inventors: Luqiong Wu, San Jose, CA (US); Linda Chu, San Jose, CA (US); Toan D. Do, San Jose, CA (US); Jack Chui, Fremont, CA (US); Praveen Krishnanunni, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/709,492

(22) Filed: Feb. 21, 2010

(51) Int. Cl.
*H03K 19/094* (2006.01)
(52) U.S. Cl. .......................................... 326/68; 326/81
(58) Field of Classification Search ............ 326/63, 326/68–71, 80, 81
See application file for complete search history.

(56) References Cited

U.S. PATENT DOCUMENTS

| | | | |
|---|---|---|---|
| 5,534,798 A * | 7/1996 | Phillips et al. | 326/108 |
| 5,781,026 A | 7/1998 | Chow | |
| 6,002,290 A | 12/1999 | Avery et al. | |
| 6,133,756 A * | 10/2000 | Kitao | 326/83 |
| 6,366,149 B1 | 4/2002 | Lee et al. | |
| 6,525,569 B1 | 2/2003 | Leon | |
| 6,777,981 B2 | 8/2004 | Kobayashi | |
| 7,180,329 B1 | 2/2007 | Sia et al. | |
| 7,400,171 B1 * | 7/2008 | Montazer | 326/83 |
| 2001/0054920 A1 | 12/2001 | Tsujino | |
| 2002/0157078 A1 | 10/2002 | Wang et al. | |
| 2004/0041587 A1 | 3/2004 | Tanaka et al. | |
| 2006/0208759 A1 | 9/2006 | Nojiri | |
| 2008/0074148 A1 | 3/2008 | Srivastava et al. | |
| 2008/0088347 A1 | 4/2008 | Li et al. | |

* cited by examiner

*Primary Examiner*—Don P Le
(74) *Attorney, Agent, or Firm*—Steven J. Cahill

(57) ABSTRACT

A level shifter circuit includes first and second transistors that receive a first input signal at control inputs. A level shifted output signal is generated by the first and the second transistors. Third and fourth transistors receive a second input signal at control inputs. The first input signal is an inverse of the second input signal. A first multiplexer circuit is configurable to couple a control input of a fifth transistor to the first and the second transistors. A second multiplexer circuit is configurable to couple a control input of a sixth transistor to the third and the fourth transistors.

23 Claims, 4 Drawing Sheets

TECHNIQUES FOR ADJUSTING LEVEL SHIFTED SIGNALS

BACKGROUND

The present invention relates to electronic circuits, and more particularly, to techniques for adjusting level shifted signals.

Integrated circuit (IC) designs increasingly require interfaces between circuit blocks that have different voltage requirements. Level shifting circuits can be used to change a voltage level of an electronic signal from a first value to a second value.

BRIEF SUMMARY

According to some embodiments of the present invention, a level shifter circuit includes first and second transistors that receive a first input signal at control inputs. A level shifted output signal is generated by the first and the second transistors. Third and fourth transistors receive a second input signal at control inputs. The first input signal is an inverse of the second input signal. A first multiplexer circuit is configurable to couple a control input of a fifth transistor to the first and the second transistors. A second multiplexer circuit is configurable to couple a control input of a sixth transistor to the third and the fourth transistors.

According to other embodiments of the present invention, a down converter circuit converts an input signal varying between a first supply voltage and a low voltage to an intermediate signal varying between a second supply voltage and the low voltage. The second supply voltage is less than the first supply voltage. First, second, and third buffer circuits are coupled in parallel. At least one of the buffer circuits is enabled to generate an output signal based on the intermediate signal. Each of the first, the second, and the third buffer circuits has a different trip point voltage at which an output voltage of the buffer circuit changes state in response to an input voltage of the buffer circuit crossing the trip point voltage. A selected combination of the buffer circuits are enabled by enable signals to adjust a duty cycle of the output signal.

Various objects, features, and advantages of the present invention will become apparent upon consideration of the following detailed description and the accompanying drawings.

DETAILED DESCRIPTION

Figure 1:
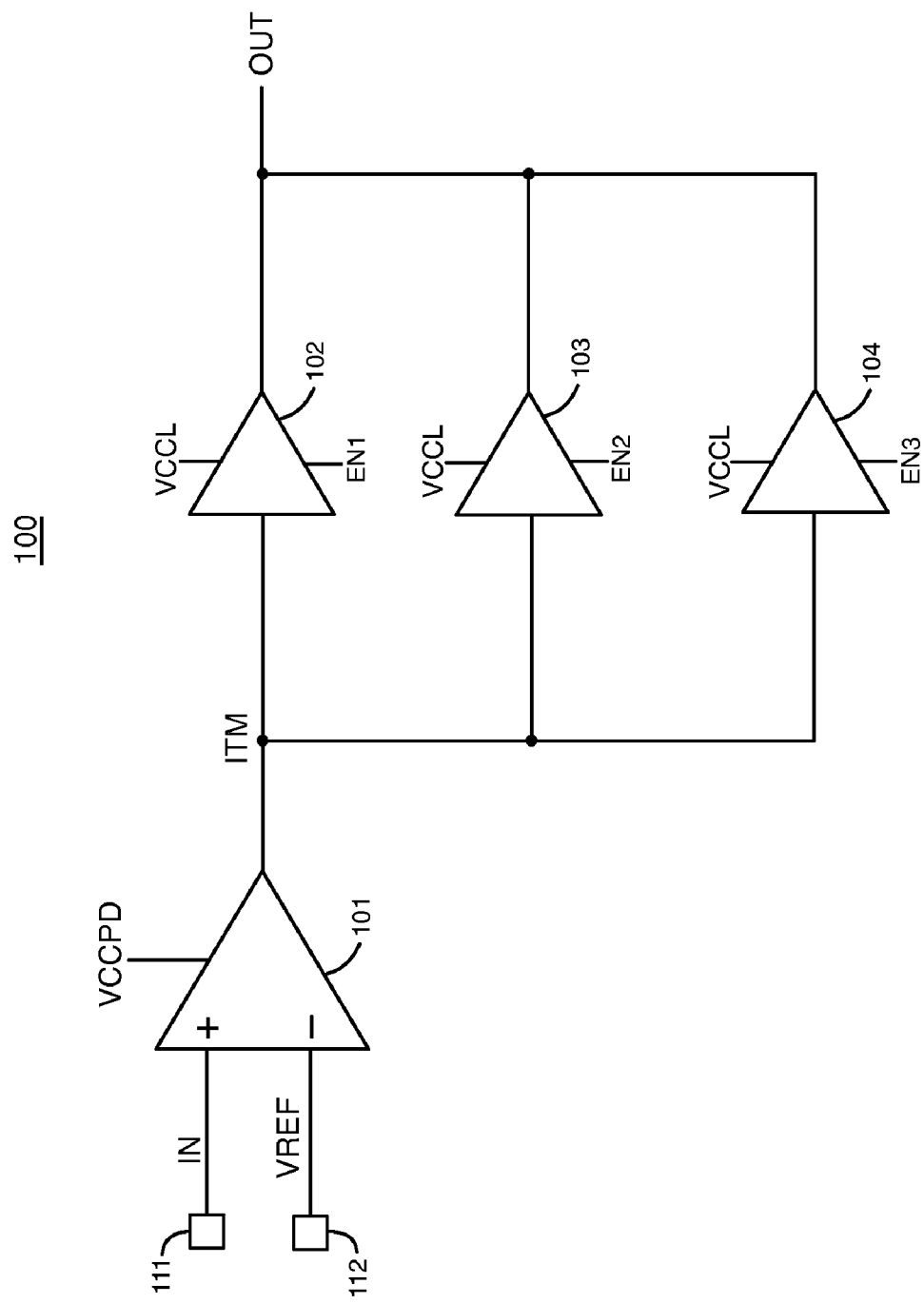
FIG. 1 illustrates an example of an input circuit that provides a duty cycle adjustment to a varying input signal, according to an embodiment of the present invention.

FIG. 1 illustrates an example of an input circuit 100 that provides a duty cycle adjustment to a varying input signal, according to an embodiment of the present invention. Input circuit 100 is typically fabricated on an integrated circuit. Input circuit 100 can be used in an input buffer such as a Series Stub Terminated Logic (SSTL) input buffer.

Input circuit 100 includes a gain and level shifting circuit 101 and buffer circuits 102-104. Buffer circuits 102-104 are coupled in parallel between the output of circuit 101 and an output terminal at output signal OUT. The inputs of circuit 101 are coupled to input pads 111-112, as shown in FIG. 1. A varying input signal IN is transmitted to the non-inverting input of circuit 101 through input pad 111 from an external source. A constant reference voltage signal VREF is transmitted to the inverting input of circuit 101 through input pad 112 from an external source.

A pre-driver supply voltage VCCPD is transmitted to a supply input of circuit 101. A core supply voltage VCCL is transmitted to the supply inputs of circuits 102-104. VCCPD is greater than VCCL. For example, VCCPD may be 2.5 volts, 1.8 volts, or 1.5 volts, and VCCL may be 0.85 volts.

Input signal IN typically has a small signal amplitude. Circuit 101 amplifies the varying voltage difference between signals IN and VREF using, for example, a differential pair of transistors. Circuit 101 then level shifts the varying input signal from VCCPD to VCCL. The output voltage signal ITM of circuit 101 is close to a full rail-to-rail signal that varies between VCCL and ground.

A smaller supply voltage VCCPD can be used to power circuit 101 in low power applications to reduce the power consumption of circuit 100. For example, using a supply voltage VCCPD of 1.8 volts reduces the power consumption by 50% compared to using a supply voltage VCCPD of 2.5 volts. A larger supply voltage VCCPD can be used to power circuit 101 in high performance applications that use a greater frequency in the input signal IN and have less jitter tolerance.

If the supply voltage VCCPD of circuit 101 is reduced enough, e.g., to 1.8 volts or 1.5 volts, the level shift down inverter in circuit 101 may cause the duty cycle of the output signal ITM to become distorted. For example, the trip point of the rise and fall edge of an inverter in circuit 101 may cause the duty cycle of signal ITM to vary from 50% by a +/−3% margin.

One or more of buffers 102-104 are enabled to buffer the output signal ITM of circuit 101 to generate a buffered output signal OUT. Circuits 102, 103, and 104 are enabled or disabled by digital enable signals EN1, EN2, and EN3, respectively. Signal OUT is transmitted to the core circuitry of the integrated circuit.

Each of the buffer circuits 102-104 can be, for example, a CMOS inverter circuit. Each of inverter circuits 102-104 has a different trip point. The trip point of each inverter circuit 102-104 is the input voltage at which the output voltage of the inverter changes from one logic state to another logic state. Each of the inverter circuits 102-104 is designed to have a different trip point. Because inverter circuits 102-104 have different trip points, different combinations of inverter circuits 102-104 can be enabled and disabled to compensate for the duty cycle distortion in signal ITM that occurs based on a reduced supply voltage VCCPD.

For example, if VCCL is 0.85 volts, VCCPD is 2.5 volts, and inverter circuits 102, 103, and 104 have trip points of 0.425, 0.40, and 0.38, respectively, inverter circuit 102 is enabled by signal EN1, and inverter circuits 103-104 are disabled by signals EN2 and EN3. Circuit 101 does not generate significant duty cycle distortion in signal ITM when circuit 101 is powered by 2.5 volts. Therefore, only one buffer circuit (inverter 102 in this example) having a trip point equal to one-half VCCL is selected to drive OUT.

As another example, if VCCL is 0.85 volts, VCCPD is 1.5 volts, and inverter circuits 102, 103, and 104 have trip points of 0.425, 0.40, and 0.38, respectively, inverter circuit 102 is enabled by signal EN1, and both of inverter circuits 103-104 are enabled by signals EN2 and EN3. The additional inverters 103-104 are enabled to adjust the combined trip point of inverters 102-104 to a smaller voltage, because the voltage of signal ITM is smaller. The adjustment of the combined trip point of inverters 102-104 to a smaller voltage causes the duty cycle of signal OUT to be closer to 50%, which significantly reduces the duty cycle distortion that would be caused by using only inverter 102 to generate signal OUT.

Figure 2:
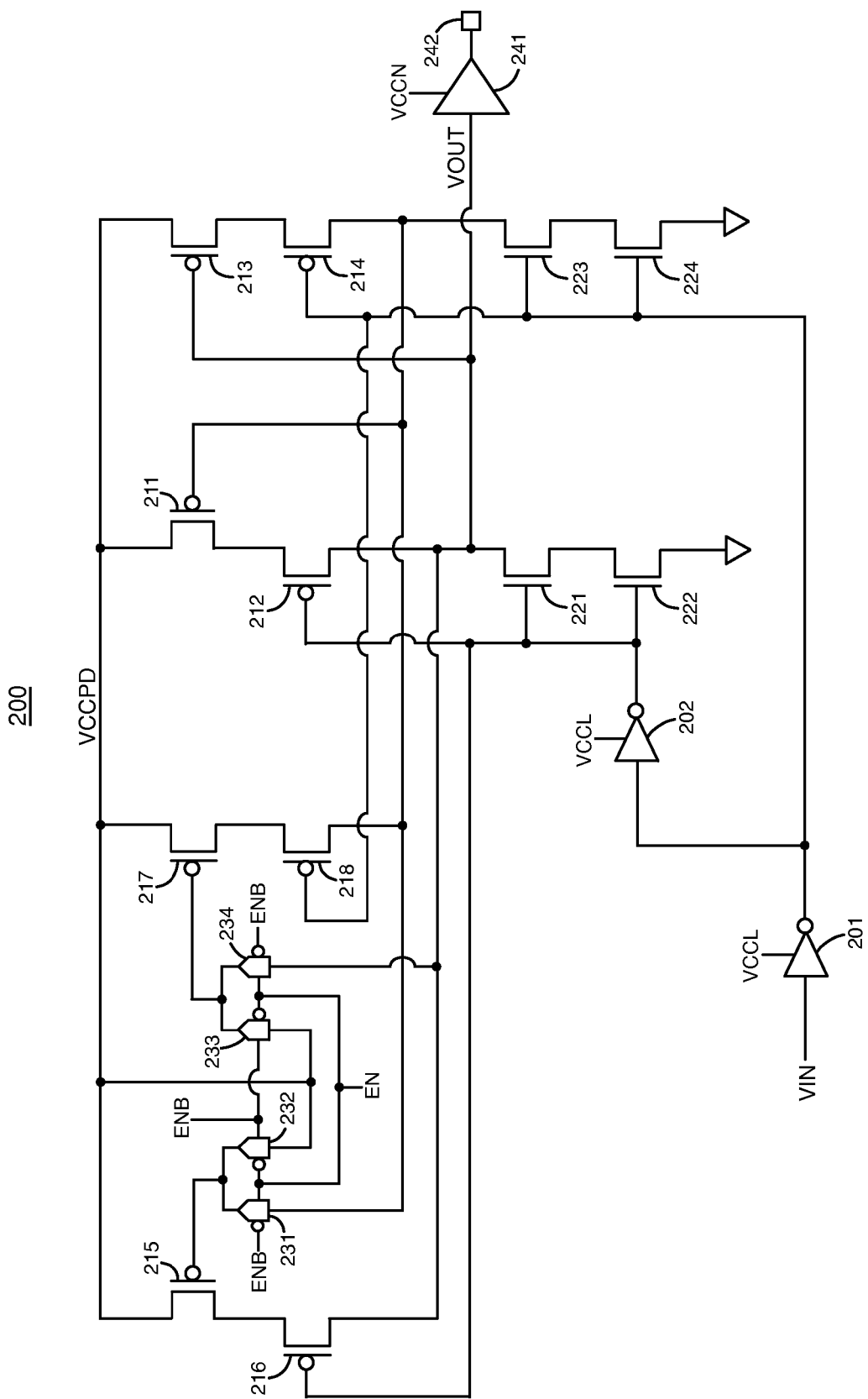
FIG. 2 illustrates an example of a level shifter circuit that level shifts an input signal into a larger supply voltage domain, according to an embodiment of the present invention.

FIG. 2 illustrates an example of a level shifter circuit 200 that level shifts an input signal into a larger supply voltage domain, according to an embodiment of the present invention. Level shifter circuit 200 is typically fabricated in an integrated circuit. Level shifter circuit 200 can, for example, be placed in an output buffer circuit. Level shifter circuit 200 can level shift a signal from a low supply voltage domain VCCL used in the core circuitry of an integrated circuit to a larger supply voltage domain VCCPD used in the input/output circuitry of the integrated circuit.

Level shifter circuit 200 includes CMOS inverter circuits 201-202, 4 n-channel metal oxide semiconductor (NMOS) field-effect transistors 221-224, 8 p-channel metal oxide semiconductor (PMOS) field-effect transistors 211-218, and 4 pass gates 231-234. VIN is the varying input voltage of level shifter circuit 200. VOUT is the varying level shifted output voltage of level shifter circuit 200. Level shifter circuit 200 level shifts VIN from a low supply voltage domain (VCCL) to a larger supply voltage domain (VCCPD) as output signal VOUT. VIN varies between VCCL and ground, and VOUT varies between VCCPD and ground. The larger supply voltage VCCPD is provided to the sources of PMOS transistors 211, 213, 215, and 217. The low supply voltage VCCL is provided to the supply inputs of CMOS inverter circuits 201-202.

Pass gates 231-234 function as multiplexer circuits. Pass gates 231-232 are a first multiplexer circuit. Pass gates 233-234 are a second multiplexer circuit. Pass gates 231-234 are controlled by two complementary control signals EN and ENB. When the EN signal is at the ground voltage (e.g., 0 volts), and the ENB signal is at VCCPD, pass gates 232-233 are on, and pass gates 231 and 234 are off. When pass gates 232-233 are on, pass gate 232 couples the gate of transistor 215 to the supply voltage node at VCCPD, and pass gate 233 couples the gate of transistor 217 to the supply voltage node at VCCPD. As a result, transistors 215 and 217 are off, and no current flows through transistors 215-218.

Transistors 215 and 217 are turned off by signals EN and ENB when supply voltage VCCPD is large enough (e.g., 2.5 volts or larger) to cause level shifter circuit 200 to generate a level shifted output voltage signal waveform for VOUT that does not have duty cycle distortion. A larger supply voltage VCCPD also allows level shifter circuit 200 to drive a higher frequency output signal VOUT that has less jitter. VCCL can be, for example, 0.85 volts.

The level shifting operation of level shifter circuit 200 is now described for when EN equals ground and ENB equals VCCPD causing transistors 215 and 217 to be off. When VIN is in a logic high state (at VCCL), the output voltage of inverter 201 is in a logic low state, and the output voltage of inverter 202 is in a logic high state (at VCCL). As a result, NMOS transistors 221-222 are on, NMOS transistors 223-224 are off, PMOS transistor 212 is off, and PMOS transistor 214 is on. Transistors 221-222 pull the output voltage VOUT to ground, turning transistor 213 on. Transistors 213-214 pull the gate voltage of transistor 211 to VCCPD, turning transistor 211 off.

When VIN is in a logic low state (at ground), the output voltage of inverter 201 is in a logic high state, and the output voltage of inverter 202 is in a logic low state. As a result, NMOS transistors 221-222 are off, NMOS transistors 223-224 are on, PMOS transistor 214 is off, and PMOS transistor 212 is on. Transistors 223-224 pull the gate voltage of transistor 211 to ground, turning transistor 211 on. Transistors 211-212 then pull the output voltage VOUT to the high supply voltage VCCPD, turning transistor 213 off.

If VCCPD is not at a large enough supply voltage (e.g., 1.5-1.8 volts), level shifter circuit 200 may generate duty cycle distortion in output voltage signal VOUT when transistors 215 and 217 are both off. A lower supply voltage may be used for VCCPD to reduce the power consumption of level shifter circuit 200 in applications that transmit a lower frequency signal VIN/VOUT to pin 242 and that have a higher jitter tolerance. For example, reducing supply voltage VCCPD from 2.5 volts to 1.8 volts can reduce power consumption by 50%, and reducing supply voltage VCCPD from 2.5 volts to 1.5 volts can reduce power consumption by 67%.

When supply voltage VCCPD is at a lower voltage (e.g., 1.5-1.8 volts), control signals EN and ENB allow PMOS transistors 215 and 217 to be turned on to provide extra pull up current from VCCPD. The extra pull up current provided by transistors 215 and 217 allows level shifter circuit 200 to generate an output voltage signal waveform for VOUT that has substantially less duty cycle distortion when VCCPD is at a lower voltage (e.g., 1.5-1.8 volts).

When EN is at VCCPD, and ENB is at ground, pass gates 231-234 allow transistors 215 and 217 to be turned on. When the EN signal is at VCCPD, and the ENB signal is at ground, pass gates 232-233 are off, and pass gates 231 and 234 are on. When pass gate 231 is on, pass gate 231 couples the gate of transistor 215 to the drain of transistor 218 and to the drains of transistors 214 and 223. When pass gate 234 is on, pass gate 234 couples the gate of transistor 217 to the drain of transistor 216 and to the drains of transistors 212 and 221. As a result, transistors 215-216 are coupled in parallel with transistors 211-212, and transistors 217-218 are coupled in parallel with transistors 213-214.

The level shifting operation of level shifter circuit 200 is now described for when EN equals VCCPD and ENB equals ground. When VIN is in a logic high state (at VCCL), NMOS transistors 221-222 are on, NMOS transistors 223-224 are off, PMOS transistor 212 is off, PMOS transistor 214 is on, PMOS transistor 216 is off, and PMOS transistor 218 is on. Transistors 221-222 pull the output voltage VOUT to ground, turning transistors 213 and 217 on. Transistors 213-214 and 217-218 pull the gate voltages of transistors 211 and 215 to VCCPD, turning transistors 211 and 215 off.

When VIN is in a logic low state (at ground), NMOS transistors 221-222 are off, NMOS transistors 223-224 are on, PMOS transistor 214 is off, PMOS transistor 212 is on, PMOS transistor 216 is on, and PMOS transistor 218 is off. Transistors 223-224 pull the gate voltages of transistors 211 and 215 to ground, turning transistors 211 and 215 on. Transistors 211-212 and 215-216 then pull the output voltage VOUT to the high supply voltage VCCPD, turning transistors 213 and 217 off.

Output buffer circuit 241 drives the level shifted output voltage VOUT to output pad 242. A third supply voltage VCCN is provided to a supply input of output buffer circuit 241. Supply voltage VCCN is equal to or less than supply voltage VCCPD and greater than supply voltage VCCL.

Figure 3:
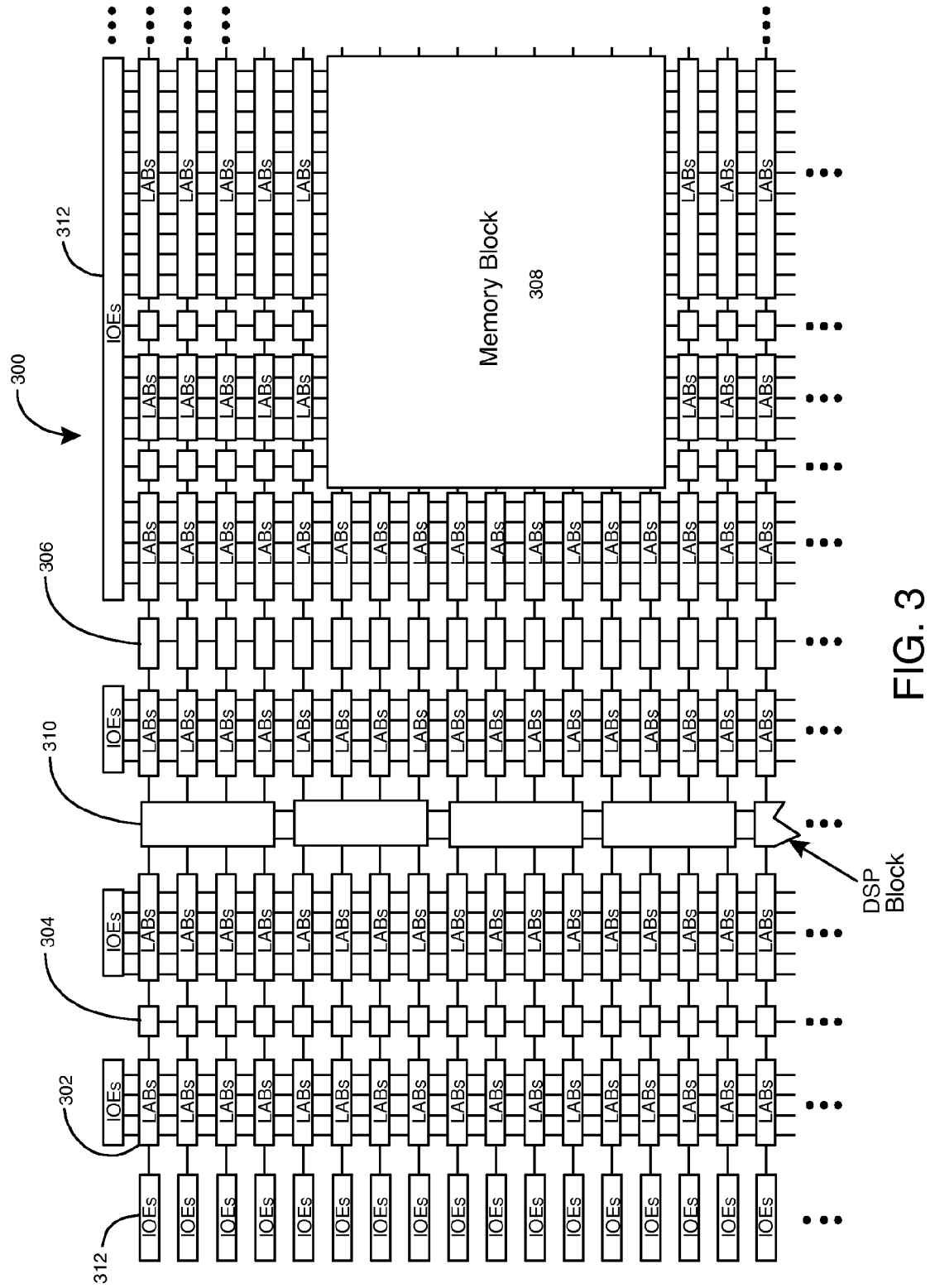
FIG. 3 is a simplified partial block diagram of a field programmable gate array (FPGA) that can include aspects of the present invention.

FIG. 3 is a simplified partial block diagram of a field programmable gate array (FPGA) 300 that can include aspects of the present invention. FPGA 300 is merely one example of an integrated circuit that can include features of the present invention. It should be understood that embodiments of the present invention described herein can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, controller integrated circuits, etc.

FPGA 300 includes a two-dimensional array of programmable logic array blocks (or LABs) 302 that are interconnected by a network of column and row interconnect conductors of varying length and speed. LABs 302 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 300 also includes a distributed memory structure including random access memory (RAM) blocks of varying sizes provided throughout the array. The RAM blocks include, for example, blocks 304, blocks 306, and block 308. These memory blocks can also include shift registers and first-in-first-out (FIFO) buffers.

FPGA 300 further includes digital signal processing (DSP) blocks 310 that can implement, for example, multipliers with add or subtract features. Input/output elements (IOEs) 312 located, in this example, around the periphery of the chip, support numerous single-ended and differential input/output standards. IOEs 312 include input and output buffers that are coupled to pads of the integrated circuit. The pads are external terminals of the FPGA die that can be used to route, for example, input signals, output signals, and supply voltages between the FPGA and one or more external devices. It should be understood that FPGA 300 is described herein for illustrative purposes only and that the present invention can be implemented in many different types of integrated circuits.

Figure 4:
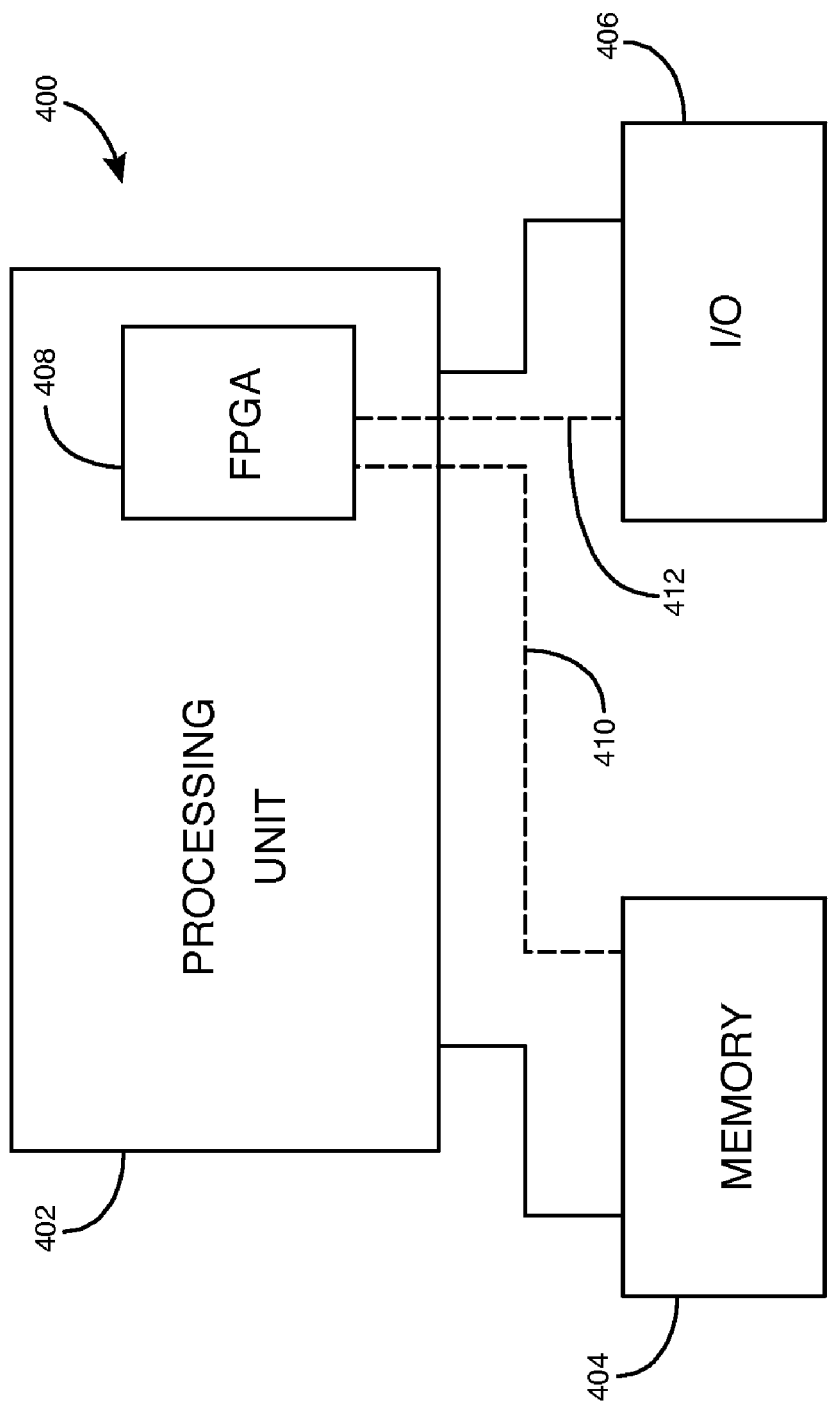
FIG. 4 shows a block diagram of an exemplary digital system that can embody techniques of the present invention.

The present invention can also be implemented in a system that has an FPGA as one of several components. FIG. 4 shows a block diagram of an exemplary digital system 400 that can embody techniques of the present invention. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404, and an input/output (I/O) unit 406 interconnected together by one or more buses. According to this exemplary embodiment, an FPGA 408 is embedded in processing unit 402. FPGA 408 can serve many different purposes within the system of FIG. 4. FPGA 408 can, for example, be a logical building block of processing unit 402, supporting its internal and external operations. FPGA 408 is programmed to implement the logical functions necessary to carry on its particular role in system operation. FPGA 408 can be specially coupled to memory 404 through connection 410 and to I/O unit 406 through connection 412.

Processing unit 402 can direct data to an appropriate system component for processing or storage, execute a program stored in memory 404, receive and transmit data via I/O unit 406, or other similar functions. Processing unit 402 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 408 can control the logical operations of the system. As another example, FPGA 408 acts as a reconfigurable processor that can be reprogrammed as needed to handle a particular computing task. Alternatively, FPGA 408 can itself include an embedded microprocessor. Memory unit 404 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A level shifter circuit comprising:
   first and second transistors receiving a first input signal at control inputs, wherein a level shifted output signal is generated by the first and the second transistors;
   third and fourth transistors receiving a second input signal at control inputs, wherein the first input signal is an inverse of the second input signal;
   fifth and sixth transistors;
   a first multiplexer circuit that is configurable to couple a control input of the fifth transistor to the first and the second transistors; and
   a second multiplexer circuit that is configurable to couple a control input of the sixth transistor to the third and the fourth transistors.

2. The level shifter circuit of claim 1 further comprising:
   a seventh transistor coupled between a drain of the fifth transistor and the third and the fourth transistors; and
   an eighth transistor coupled between a drain of the sixth transistor and the first and the second transistors.

3. The level shifter circuit of claim 2 further comprising:
   a ninth transistor coupled between the first transistor and a node at a first supply voltage; and
   a tenth transistor coupled between the third transistor and the node at the first supply voltage.

4. The level shifter circuit of claim 3 wherein a control input of the ninth transistor is coupled between the third and the fourth transistors, and wherein a control input of the tenth transistor is coupled between the first and the second transistors.

5. The level shifter circuit of claim 4 further comprising:
   an eleventh transistor coupled in series with the second transistor, wherein a control input of the eleventh transistor receives the first input signal; and a twelfth transistor coupled in series with the fourth transistor, wherein a control input of the twelfth transistor receives the second input signal.

6. The level shifter circuit of claim 2 wherein a control input of the seventh transistor receives the second input signal, and a control input of the eighth transistor receives the first input signal.

7. The level shifter circuit of claim 3 further comprising:
an inverter circuit that inverts the second input signal to generate the first input signal, wherein the inverter circuit receives a second supply voltage that is less than the first supply voltage.

8. A circuit comprising:
first transistors coupled in series, wherein one of the first transistors has a control input that receives a first input signal, and the first transistors provide charge to an output signal that is a level shifted version of the first input signal;
second transistors coupled in series, wherein one of the second transistors has a control input receiving a second input signal, and the first input signal is inverted relative to the second input signal;
first and second multiplexers; and
third transistors and fourth transistors, wherein the first multiplexer is configurable to enable the third transistors to conduct current in parallel with the first transistors to the output signal in response to the first input signal, and the second multiplexer is configurable to enable the fourth transistors to conduct current in parallel with the second transistors in response to the second input signal.

9. The circuit of claim 8 further comprising:
fifth transistors coupled in series with the first transistors, wherein a control input of each of the fifth transistors receives the first input signal; and
sixth transistors coupled in series with the second transistors, wherein a control input of each of the sixth transistors receives the second input signal.

10. The circuit of claim 9 wherein the first transistors comprise two p-channel transistors, the second transistors comprise two p-channel transistors, the third transistors comprise two p-channel transistors, the fourth transistors comprise two p-channel transistors, the fifth transistors comprise two n-channel transistors, and the sixth transistors comprise two n-channel transistors.

11. The circuit of claim 9 wherein a control input of one of the first transistors is coupled between the second and the sixth transistors, and a control input of one of the second transistors is coupled between the first and the fifth transistors.

12. The circuit of claim 11 wherein the first multiplexer is configurable to couple a control input of one of the third transistors between the second and the sixth transistors, wherein the second multiplexer is configurable to couple a control input of one of the fourth transistors between the first and the fifth transistors, wherein the third transistors are coupled in series, and wherein the fourth transistors are coupled in series.

13. The circuit of claim 8 wherein the first multiplexer is configurable to turn off one of the third transistors to block current through the third transistors, and the second multiplexer is configurable to turn off one of the fourth transistors to block current through the fourth transistors.

14. The circuit of claim 13 wherein the first multiplexer is configurable to couple a control input of one of the third transistors to a supply voltage node, the second multiplexer is configurable to couple a control input of one of the fourth transistors to the supply voltage node, and the third and the fourth transistors are p-channel transistors.

15. The circuit of claim 8 wherein the circuit is in an integrated circuit.

16. A method comprising:
enabling a first current path using a first multiplexer;
pulling a voltage on a first node to a low voltage through a second current path in response to a first input signal to cause a first transistor in the first current path and a second transistor in a third current path to turn on;
pulling a level shifted output voltage to a first supply voltage in response to a second input signal through the first and the third current paths;
enabling a fourth current path using a second multiplexer;
pulling the level shifted output voltage to the low voltage through a fifth current path in response to the second input signal to cause a third transistor in the fourth current path and a fourth transistor in a sixth current path to turn on; and
pulling the voltage on the first node to the first supply voltage through the fourth and the sixth current paths in response to the first input signal, wherein the first and the second input signals are complementary signals.

17. The method of claim 16 wherein the first and the third current paths are coupled in parallel, and the fourth and the sixth current paths are coupled in parallel.

18. The method of claim 16 wherein enabling a first current path using a first multiplexer further comprises coupling a control input of the first transistor in the first current path to the first node, and wherein enabling a fourth current path using a second multiplexer further comprises coupling a control input of the third transistor in the fourth current path to a second node at the level shifted output voltage.

19. The method of claim 16 further comprising:
inverting the first input signal to generate the second input signal using charge from a second supply voltage that is less than the first supply voltage, wherein the first and the second input signals vary between the second supply voltage and the low voltage.

20. The method of claim 16 wherein pulling a level shifted output voltage to a first supply voltage in response to a second input signal through the first and the third current paths further comprises turning on a fifth transistor in the first current path and turning on a sixth transistor in the third current path in response to the second input signal, and
wherein pulling the voltage on the first node to the first supply voltage through the fourth and the sixth current paths in response to the first input signal further comprises turning on a seventh transistor in the fourth current path and turning on an eighth transistor in the sixth current path in response to the first input signal.

21. The method of claim 16 further comprising:
disabling the first current path using the first multiplexer; and
disabling the fourth current path using the second multiplexer.

22. A circuit comprising:
a down converter circuit that converts an input signal varying between a first supply voltage and a low voltage to an intermediate signal varying between a second supply voltage and the low voltage, wherein the second supply voltage is less than the first supply voltage; and
first, second, and third buffer circuits that are coupled in parallel, wherein at least one of the buffer circuits is enabled to generate an output signal based on the intermediate signal, wherein each of the first, the second, and the third buffer circuits has a different trip point voltage at which an output voltage of the buffer circuit changes state in response to an input voltage of the buffer circuit crossing the trip point voltage, and wherein a selected combination of the buffer circuits are enabled by enable signals to adjust a duty cycle of the output signal.

23. The circuit of claim 22 wherein each of the first, the second, and the third buffer circuits comprises an inverter circuit, and wherein the down converter circuit receives the input signal from an input pad.

* * * * *